United States Patent
Lee et al.

(10) Patent No.: US 7,301,774 B2
(45) Date of Patent: Nov. 27, 2007

(54) UNIVERSAL LOCKING DEVICE FOR HEAT SINK

(75) Inventors: Hsieh-Kun Lee, Tu-Cheng (TW);
Cheng-Tien Lai, Tu-Cheng (TW);
Shao-Long Zhai, Shenzhen (CN);
Zhi-Yong Zhou, Shenzhen (CN)

(73) Assignees: Fu Zhun Precision Industry (Shenzhen) Co., Ltd., Bao'an District, Shenzhen, Guangdong Privince (CN);
Foxconn Technology Co., Ltd., Tu-Cheng, Taipei Hsien (TW)

( * ) Notice: Subject to any disclaimer, the term of this patent is extended or adjusted under 35 U.S.C. 154(b) by 240 days.

(21) Appl. No.: 11/210,130

(22) Filed: Aug. 23, 2005

(65) Prior Publication Data
US 2006/0120053 A1   Jun. 8, 2006

(30) Foreign Application Priority Data
Dec. 4, 2004   (CN) .................. 2004 2 0102414

(51) Int. Cl.
*H05K 7/20* (2006.01)
*H01L 23/34* (2006.01)
*F28F 7/00* (2006.01)

(52) U.S. Cl. .................. 361/719; 361/704; 257/718; 257/719; 165/80.2; 165/80.3; 174/16.1; 174/16.3

(58) Field of Classification Search .......... 361/704, 361/719; 257/718–719; 165/80.2–80.3; 174/16.1, 16.3
See application file for complete search history.

(56) References Cited

U.S. PATENT DOCUMENTS

| | | | | |
|---|---|---|---|---|
| 5,903,972 A * | 5/1999 | Boe | ............................. | 29/832 |
| 6,307,748 B1 * | 10/2001 | Lin et al. | .................... | 361/704 |
| 6,795,317 B1 * | 9/2004 | Liu | ............................. | 361/704 |
| 7,142,422 B2 * | 11/2006 | Lee et al. | .................... | 361/695 |
| 7,190,586 B2 * | 3/2007 | Franz et al. | ................. | 361/704 |
| 2003/0159819 A1 * | 8/2003 | Lee | ............................ | 165/185 |
| 2007/0097649 A1 * | 5/2007 | Yang et al. | ................. | 361/704 |

FOREIGN PATENT DOCUMENTS

TW   586652   1/2004

* cited by examiner

*Primary Examiner*—Boris Chérvinsky
*Assistant Examiner*—Zachary M Pape
(74) *Attorney, Agent, or Firm*—Morris Manning Martin LLP; Tim Tingkang Xia, Esq.

(57) ABSTRACT

A locking device for securing a heat sink to a heat generating component includes a locking plate, a plurality of locking feet each pivotably attached to the locking plate and a plurality of locking members attached to the locking feet. Adjacent two of the plurality of locking feet are capable of rotating towards each other from a first position at which the locking feet are located apart from each other with the locking members defining a first mounting position to a second position at which the locking feet are stacked together with the locking members defining a second mounting position.

20 Claims, 5 Drawing Sheets

UNIVERSAL LOCKING DEVICE FOR HEAT SINK

BACKGROUND

1. Field

The present invention relates generally to a locking device, and more particularly to a locking device which can secure a heat sink to a heat generating device mounted on different PCBs with different layouts.

2. Prior Art

It is widely acknowledged that heat is produced during operation of electronic devices such as central processing units (CPUs). The heat produced must be quickly removed to ensure the CPUs working normally. Typically, a heat sink is provided to remove heat from the CPU. In order to keep the heat sink intimately contacting with the CPU, a locking device is generally required.

For instance, FIG. 7 illustrates a conventional locking device used for securing a heat sink to a CPU 1 mounted on a printed circuit board (PCB) 2. The locking device comprises a planar locking plate 3 and a plurality of screws 4. The heat sink comprises a radial fin section 7 and a heat-conducting pillar 5 having an upright column 6. A plurality of retaining members 9 each with a retaining hole, i.e. threaded hole defined therein, is provided at the PCB 2 surrounding the CPU 1. The locking plate 3 at corners thereof defines a plurality of through holes 8 in alignment with the threaded holes of the retaining members 9. In assembly, the fin section 7 is attached to the column 6 after the column 6 extends through and projects beyond the locking plate 3. The screws 4 extend through the through holes 8 of the locking plate 3 and further engage with the PCB 2 in the threaded holes of the retaining members 9 respectively, to cause the locking plate 3 to press the pillar 5 downwardly against the CPU 1. Thus, the heat sink is secured to the CPU 1 for heat dissipation. However, the above-mentioned locking device is only applicable for securing the heat sink to the PCB with the retaining members 9 completely in alignment with the through holes 8 of the locking plate 3. Instead, when the PCB having retaining members 9 different from the above-mentioned layout is used, it is impossible for the above-mentioned locking device to do such a securing job.

SUMMARY

Accordingly, what is needed is a locking device which is able to match with PCBs having retaining configurations with different layouts so that the locking device can be used to lock a heat sink to different PCBs having different layouts.

A locking device in accordance with a preferred embodiment of the present invention is used to secure a heat dissipation device to a heat generating component. The locking device comprises a locking plate, a plurality of locking feet each pivotably attached to the locking plate and a plurality of locking members attached to the locking feet. Adjacent two of the plurality of locking feet are capable of rotating towards each other from a first position at which the locking feet are located apart from each other with the locking members defining a first mounting position to a second position at which the locking feet are stacked together with the locking members defining a second mounting position.

Other advantages and novel features of the present invention will become more apparent from the following detailed description when taken in conjunction with the accompanying drawings, in which:

DETAILED DESCRIPTION OF THE EMBODIMENTS

Figure 1:
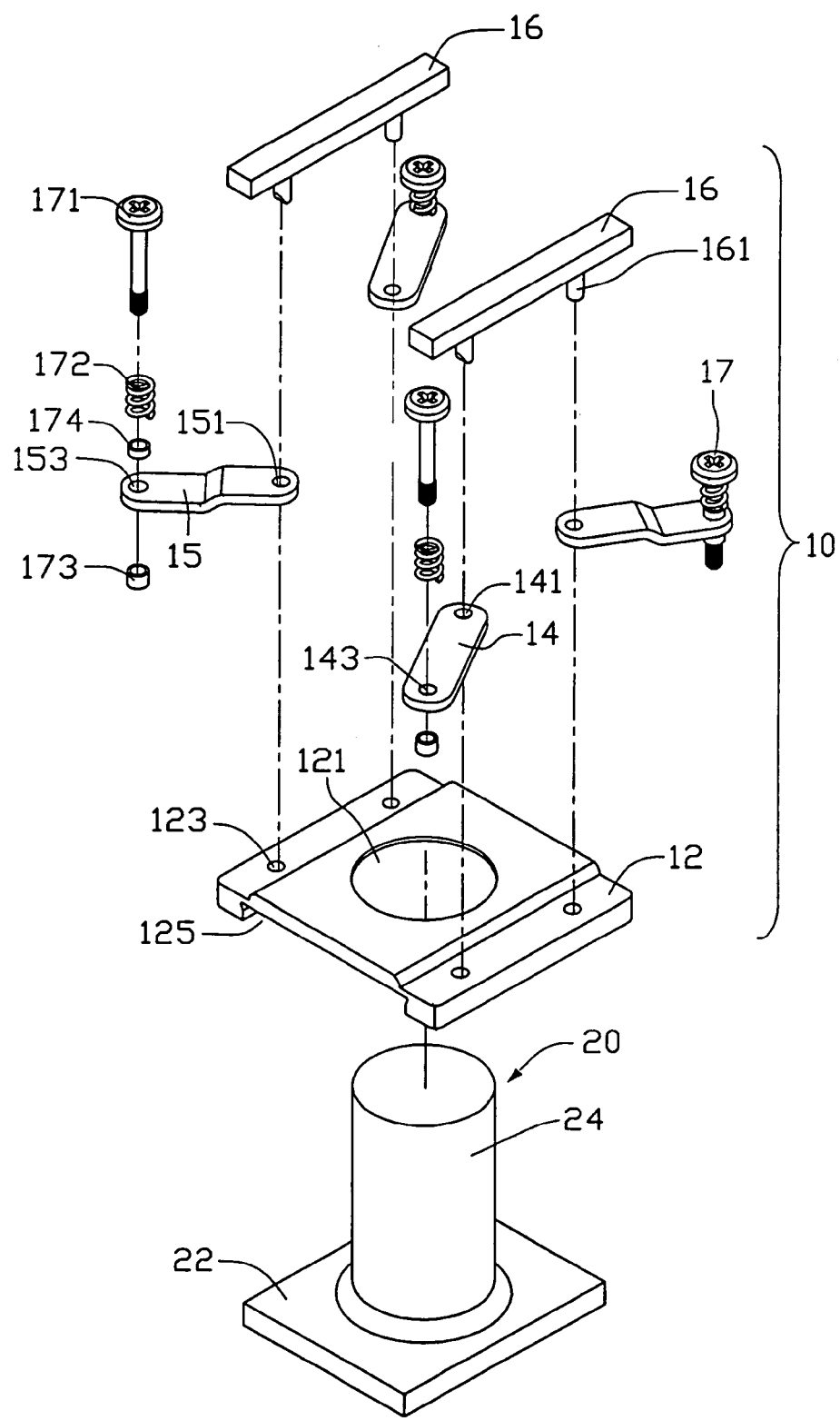
FIG. 1 is an exploded, isometric view of a locking device according to a preferred embodiment of the present invention for securing a heat sink.

Reference will now be made to the drawing figures to describe the present invention in detail.

FIG. 1 illustrates a locking device 10 according to the first preferred embodiment of the present invention, for securing a heat sink to a heat generating component such as a CPU (not shown) mounted on a PCB (not shown).

Figure 7:
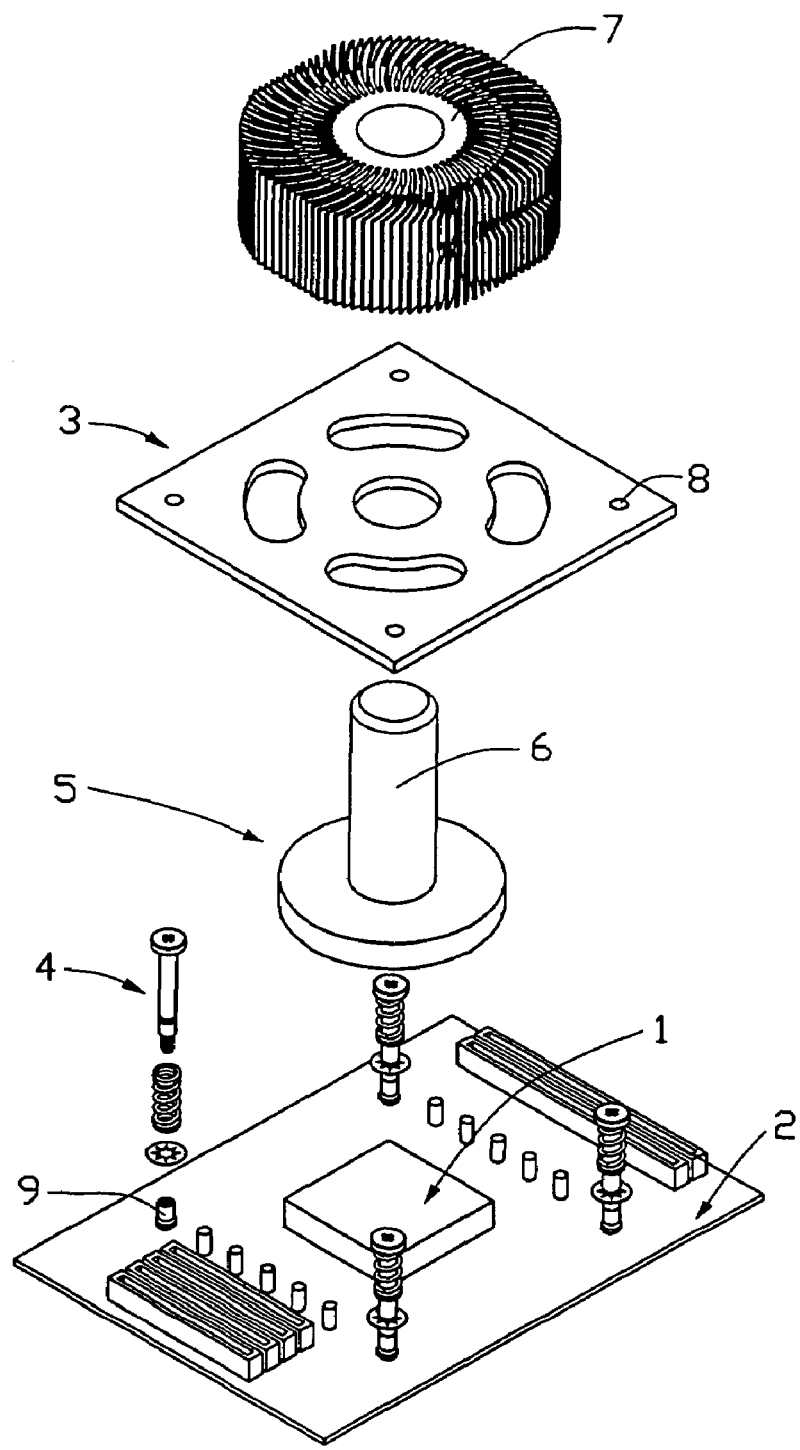
FIG. 7 is an exploded, isometric view of a conventional locking device for securing a heat sink.

The heat sink comprises a heat-removing member 20 for removing heat from the CPU. The heat-removing member 20 comprises a flat base 22 and a column 24 uprightly extending from the base 22. The column 24 can be formed by a solid metal bar or a heat pipe. The base 22 is used for engaging with the CPU to thereby absorb heat from the CPU. The base 22 and the column 24 may be integrally formed or may be separate ones bonded together via conventional methods such as soldering. A radial fin section (not shown) like the radial fin section 7 of FIG. 7 is used to be attached to the column 24 to dissipate the heat absorbed by the base 22 of the heat-removing member 20 from the CPU.

The locking device 10 comprises a locking plate 12, a pair of flat locking feet 14, a pair of step-like locking feet 15, a pair of positioning pieces 16 for attaching the locking feet 14, 15 to the locking plate 12, and four locking members 17 for securing the locking feet 14, 15 to the PCB. The locking plate 12 is substantially rectangular in shape and at a center thereof defines a through hole 121 for receiving the column 24 of the heat-removing member 20 therein. Four positioning holes 123 are defined at four corners of the locking plate 12, respectively, for positioning of the locking feet 14, 15. A receiving groove 125 is defined at an underside of the locking plate 12 for receiving the base 22 of the heat-removing member 20. Each of the flat locking feet 14 defines a locating aperture 141 and a fixing aperture 143 at opposite ends thereof. Similarly, a locating aperture 151 and a fixing aperture 153 are defined at opposite ends of each step-like locking foot 15, respectively. Each step-like locking foot 15 is bent at a center portion thereof to thereby form a two-section configuration, which has a first section (not labeled) lower than a second section (not labeled). Each positioning piece 16 has two positioning posts 161 extending downwardly from opposite ends thereof. In this case, each of the locking members 17 comprises a bolt 171, a helical spring 172 and a bushing 173. For each of the step-like locking feet 15, the locking member 17 is further provided with a gasket 174 to make up for the height difference between the two sections thereof, so that, when assembled, all of the springs 172 of the locking members 17 are uniformly compressed and accordingly obtains an uniform downward pressing force against the heat sink.

Figure 2:
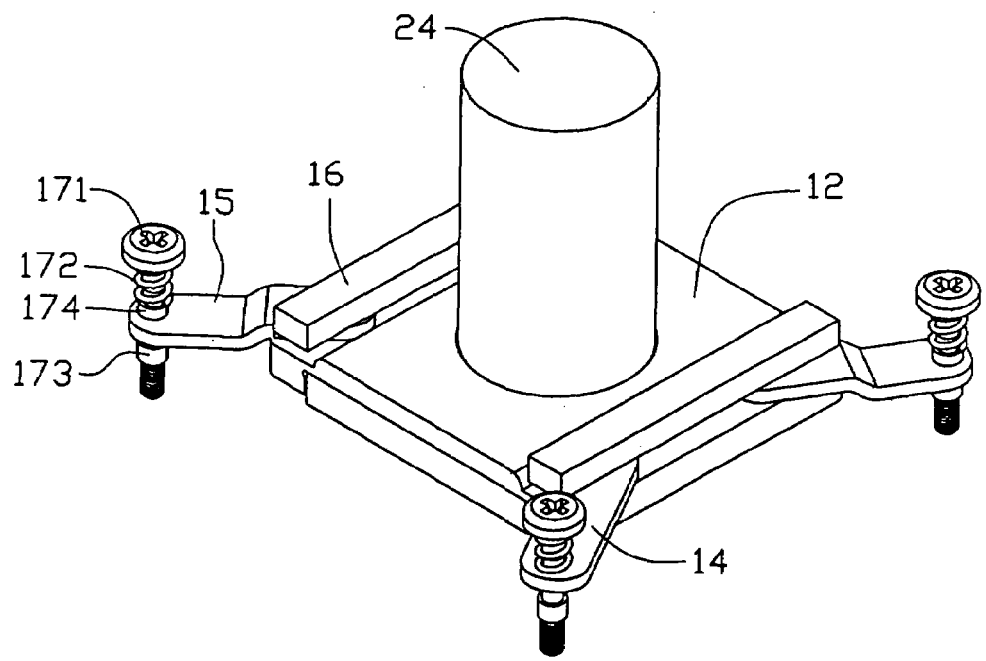
FIG. 2 is an assembled view of FIG. 1.

Referring also to FIG. 2, in assembly, the column 24 of the heat-removing member 20 extends through the through hole 121 of the locking plate 12. The base 22 is received in the receiving groove 125 of the locking plate 12. The heat dissipating fin section (not shown) is attached to the column 24 of the heat-removing member 20 so that heat generated by the CPU can be conducted through the member 20 to the fin section where the heat dissipates to ambient air. The positioning pieces 16 are attached to the locking plate 12 at two opposite sides of the locking plate 12 via the positioning posts 161 extending through the locating apertures 141, 151 of the locking feet 14, 15 and into the positioning holes 123 of the locking plate 12, respectively. As a result, the locking feet 14, 15 are pivoted to the locking plate 12 about the positioning posts 161 with their free ends extending away from the locking plate 12. The bolts 171, with the springs 172 combined thereto, respectively extend through the fixing apertures 143, 153 at free ends of the locking feet 14, 15. Here, the locking feet 14, 15 are respectively located at four corners of the locking plate 12, which defines a mounting position suitable for securing the heat sink to a PCB with corresponding retaining holes aligning with the fixing apertures 143, 153, for the bolts 171 to be engaged therewith.

Figure 3:
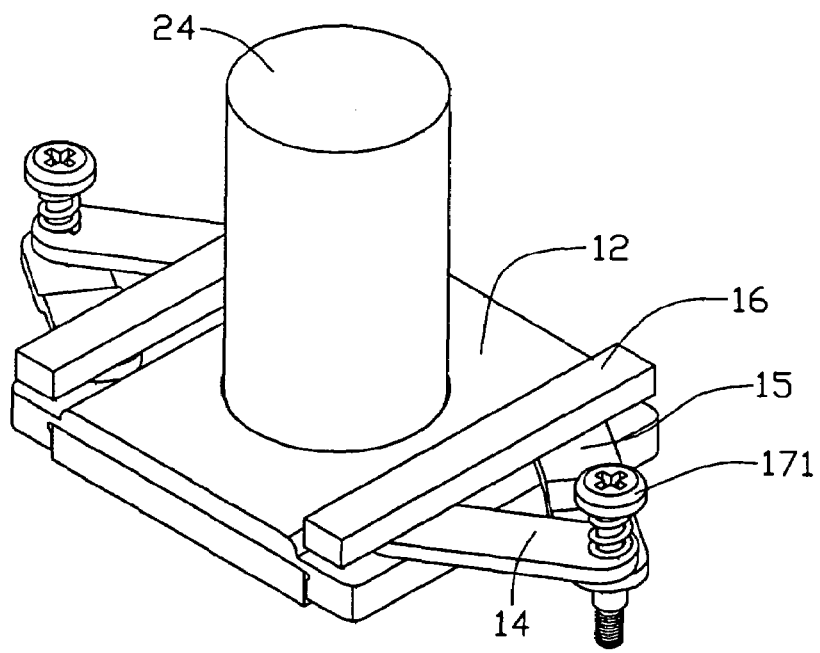
FIG. 3 is an assembled view of FIG. 1, but constructed in another way.

Referring to FIG. 3, the adjacent two locking feet 14, 15 subjected to the same positioning piece 16 are stacked with one another at their free ends. Here, each flat locking foot 14 is positioned on the first section of each step-like locking foot 15. In this embodiment, the fixing apertures 143, 153 are aligned with each other. The locking member 17 is used to extend through the aligned fixing apertures 143, 153, to engage with a corresponding mating member in the PCB. Thus, the locking device 10 defines another mounting position suitable for securing the heat sink to another kind of PCB with retaining holes in a different layout from the PCB for the locking device of FIG. 2.

In the present invention, the locking feet 14, 15 are capable of rotating about the positioning posts 161 of the positioning pieces 16 in a plane parallel to the locking plate 12. The flat locking feet 14 and the step-like locking feet 15 are arranged in an alternated way so that adjacent two locking feet 14, 15 subjected to the same positioning piece 16 are capable of moving towards each other from a first position at which the two locking feet 14, 15 are located apart from each other to a second position at which the two locking feet 14, 15 are stacked at their free ends. When the locking feet 14, 15 are located at the first position, as shown in FIG. 2, the locking feet 14, 15 are respectively located at four corners of the locking plate 12 and thus define a mounting position suitable for securing the heat sink to a PCB with four retaining holes. When the locking feet 14, 15 are located at the second position, as shown in FIG. 3, the adjacent two locking feet 14, 15 subjected to the same positioning piece 16 are stacked with one on the other at their free ends and thus define another mounting position suitable for securing the heat sink to another kind of PCB with two retaining holes in a different layout from the PCB for the locking device of FIG. 2. Thus, the locking device 10 of present invention can secure heat sinks to different kinds of PCBs with retaining holes in different layouts.

Figure 4:
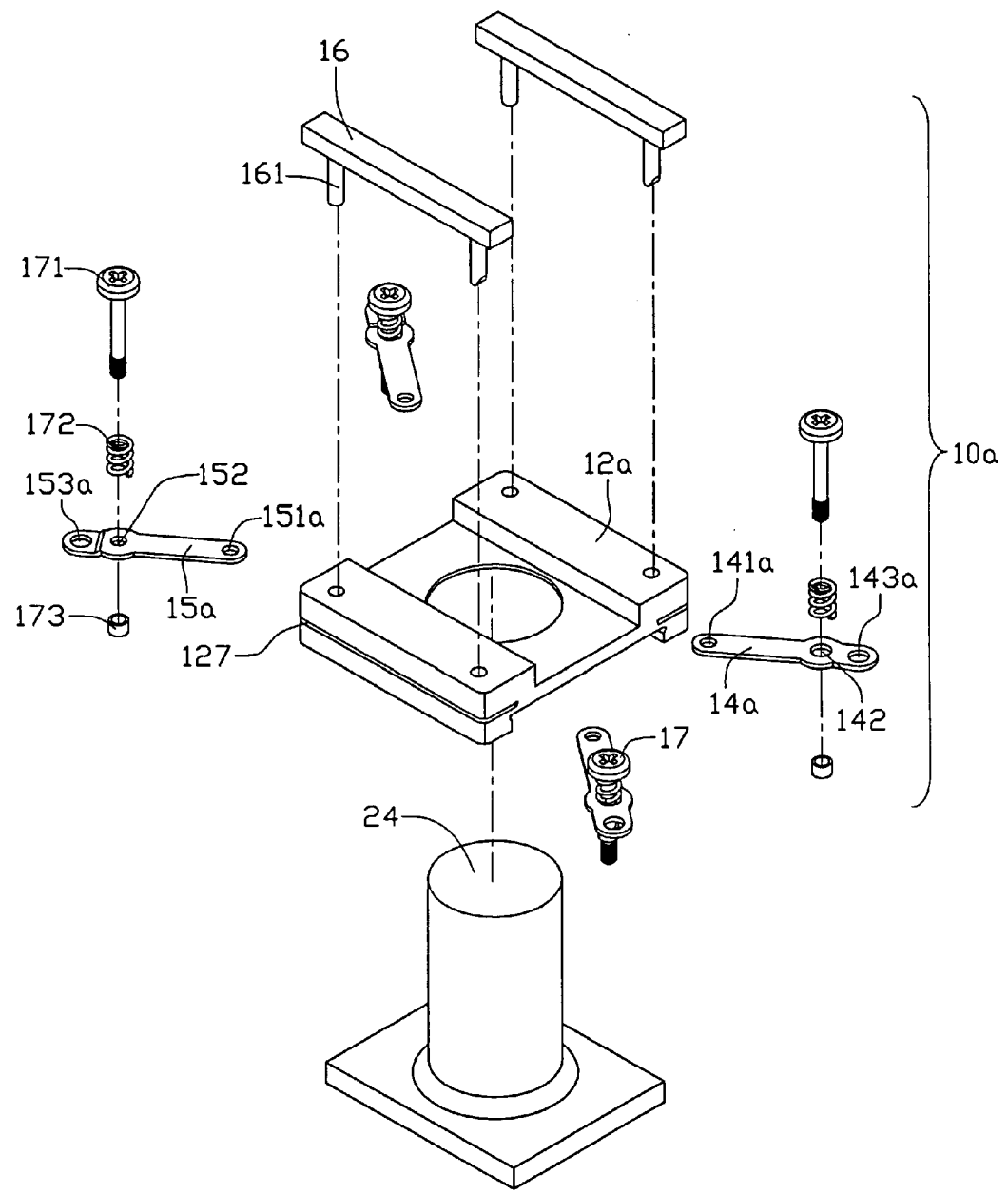
FIG. 4 is an exploded, isometric view of a locking device according to an alternative embodiment of the present invention for securing a heat sink.
Figure 5:
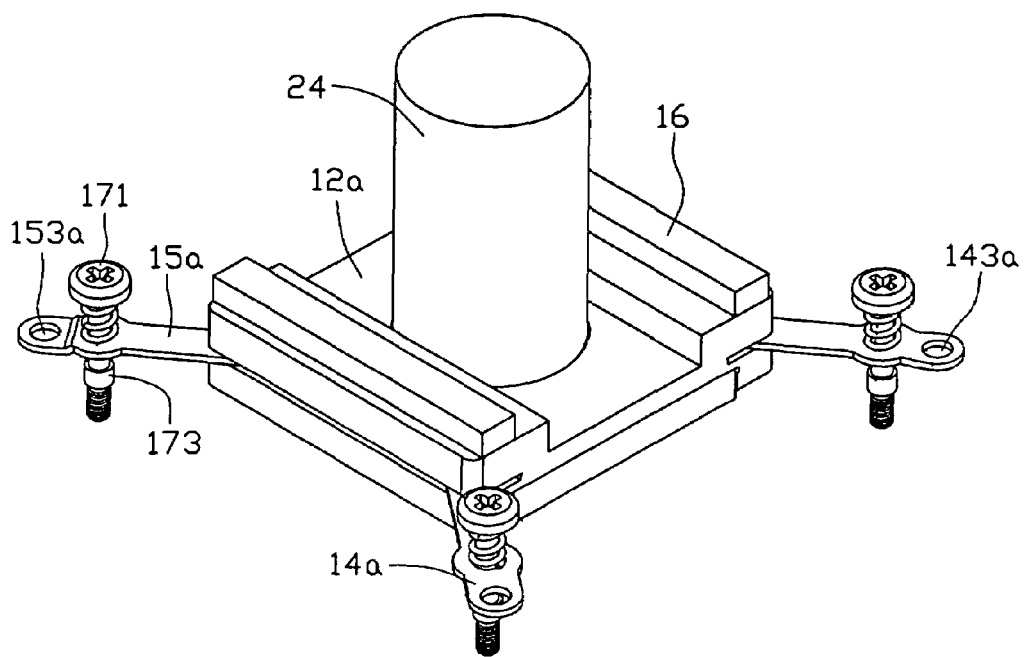
FIG. 5 is an assembled view of FIG. 4.
Figure 6:
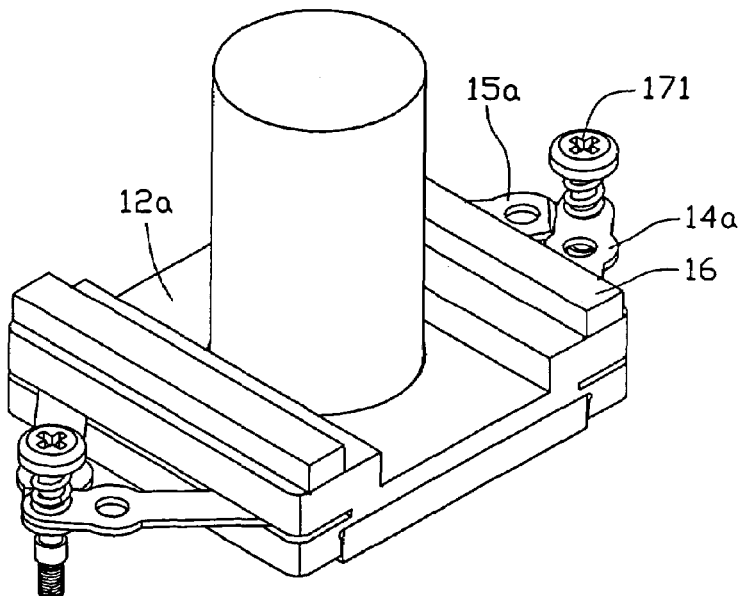
FIG. 6 is an assembled view of FIG. 4, but constructed in another way.

FIGS. 4-6 illustrate a locking device 10a of the alternative embodiment of the present invention. Compared with the first embodiment, the locking plate 12a of the locking device 10a defines a pair of receiving slots 127 at two opposite sides thereof, for receiving a first end of each of the locking feet 14a, 15a therein. Each flat locking foot 14a defines a locating aperture 141a, a first fixing apertures 142 and a second fixing aperture 143a sequentially therein, wherein the first fixing aperture 142 and the second fixing aperture 143a are located in a close relation at a second end of flat locking foot 14a. Similarly, each step-like locking foot 15a also defines a locating aperture 151a, a first fixing apertures 152 and a second fixing aperture 153a sequentially, with the first fixing aperture 152 and the second fixing aperture 153a located in a close relation, and only the second fixing aperture 153a located at its first section of the locking foot 15a. The first fixing aperture 152 and the locating aperture 151a are located at the second section of the step-like locking foot 15a, wherein the first section is lower than the second section. The locking feet 14a, 15a are mounted to the locking plate 12a, by inserting the first ends of the feet 14a, 15a in which the locating apertures 151a are defined into the receiving slots 127. Then, the positioning posts 161 of the positioning pieces 16 are inserted into the locking plate 12a to a position in which the locking feet 15a are pivoted to the positioning posts 161, respectively. As shown in FIG. 5, when the locking feet 14a, 15a are respectively attached to and located at four corners of the locking plate 12a while the locking members 17 are attached to the first fixing apertures 142, 152 of the locking feet 14a, 15a, a first mounting position is defined for securing the heat sink. Obviously, when the locking members 17 are attached to the second fixing apertures 143a, 153a of the locking feet 14a, 15a, another mounting position is accordingly defined for securing the heat sink. As shown in FIG. 6, when adjacent two locking feet 14a, 15a subjected to the same positioning piece 16 move towards each other until their distal free ends are stacked together with their second fixing apertures 143a, 153a in line with each other, an alternative mounting position for securing of the heat sink is defined, in which a locking member 17 extends through the aligned second fixing apertures 143a, 153a to threadedly engage with a mating member on the PCB.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A locking device for a heat sink comprising:
    a locking plate;
    a plurality of locking feet each pivotably attached to the locking plate; and
    a plurality of locking members attached to the locking feet for securing said heat sink;
    wherein, adjacent two locking feet being capable of rotating towards each other from a first position at which the locking feet are located apart from each other with the locking members defining a first mounting position to a second position at which the adjacent two locking feet are stacked together with the locking members defining a second mounting position.

2. The locking device of claim 1, wherein one of the adjacent two locking feet has a step-like configuration for facilitating the stacking of the two locking feet at the second position.

3. The locking device of claim 2, wherein each of the locking members comprises a bolt and a spring member attached to the bolt.

4. The locking device of claim 3, wherein a gasket is provided to the locking foot having the step-like configuration for making up for the height difference due to the step-like configuration so as to provide an uniform pressing force against the locking feet by the spring members.

5. The locking device of claim 1, wherein each of the locking feet has a free end extending away from the locking plate.

6. The locking device of claim 5, wherein the free end of each of the locking feet defines at least a through aperture for extension of the locking member.

7. The locking device of claim 1, wherein the locking plate is substantially rectangular in shape with a through hole defined at a center thereof.

8. The locking device of claim 7, wherein the locking feet are respectively attached to four corners of the locking plate.

9. The locking device of claim 1, wherein each of the locking feet is attached to the locking plate via a positioning piece.

10. The locking device of claim 9, wherein each of the locking feet at an end thereof defines an aperture therein, the locking plate defines a hole corresponding with the aperture, and wherein the positioning piece comprises a positioning post positioned in the aperture and the hole.

11. A heat dissipating assembly comprising:
a heat dissipation device;
a locking plate rested on the heat dissipation device;
a plurality of locking feet each comprising a first end pivotably attached to the locking plate and a second end extending away from the locking plate, adjacent two locking feet being capable of moving relative to each other to cause the second ends thereof apart from each other or stacked together; and
locking members attached to the second ends of the locking feet for urging the locking plate against the heat dissipation device.

12. The heat dissipating assembly of claim 11, wherein each of the locking feet at the second end thereof defines at least a through aperture for extension of the locking member.

13. The heat dissipating assembly of claim 12, wherein one of the adjacent two locking feet has a step-like configuration between the first end and the second end thereof for facilitating the stacking of the two locking feet.

14. The heat dissipating assembly of claim 13, wherein the second end of one of the adjacent two locking feet offsets perpendicularly from the first end thereof such that corresponding apertures of the adjacent two locking feet are in alignment when the adjacent two locking feet are stacked together.

15. The heat dissipating assembly of claim 11, wherein the locking plate defines a through hole at a center thereof.

16. The heat dissipating assembly of claim 15, wherein the heat dissipation device comprises a heat-removing member.

17. The heat dissipating assembly of claim 16, wherein the heat-removing member comprises a column receiving in the through hole of the locking member and a base beneath the pressing frame.

18. A heat dissipating assembly comprising:
a heat-removing member comprising a base for contacting with a heat-generating electronic component, and a column vertically extending upwardly from the base;
a locking plate mounted on the heat-removing member, having a hole through which the column extends;
a plurality of locking feet pivotably mounted to the locking plate for securing the locking plate, wherein the locking feet are movable between first position and second position wherein at the first position the locking feet are separated from each other, and at the second position every two of the looking feet are connected together; and
a plurality of locking members inserted through the locking feet, respectively.

19. The heat dissipating assembly of claim 18, wherein the locking feet have two configurations, of which one is a flat configuration and the other is a step-like configuration.

20. The heat dissipating assembly of claim 19, wherein each of the locking feet has two locking holes at a free end thereof, at the first position, a corresponding locking member being inserted through one of the locking holes, and at the second position the corresponding member being inserted through the other of the locking holes.

* * * * *